(12) United States Patent
Das et al.

(10) Patent No.: US 8,499,445 B1
(45) Date of Patent: Aug. 6, 2013

(54) METHOD OF FORMING AN ELECTRICALLY CONDUCTIVE PRINTED LINE

(75) Inventors: Rabindra N. Das, Vestal, NY (US);
Frank D. Egitto, Binghamton, NY (US);
Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 13/184,699

(22) Filed: Jul. 18, 2011

(51) Int. Cl.
*H05K 3/40* (2006.01)

(52) U.S. Cl.
USPC ............... 29/847; 29/850; 29/846; 29/852; 977/753

(58) Field of Classification Search
USPC ............... 29/890.1, 832, 831, 830, 852, 846, 29/847; 347/54, 68–70, 71; 429/34, 44, 40, 429/46; 438/396, 393, 381, 782; 977/742
See application file for complete search history.

(56) References Cited

U.S. PATENT DOCUMENTS

| | | | |
|---|---|---|---|
| 4,156,040 A * | 5/1979 | Swider et al. | 148/527 |
| 4,604,298 A | 8/1986 | Shevtchuk et al. | |
| 5,039,824 A | 8/1991 | Takashima et al. | |
| 6,473,966 B1 * | 11/2002 | Kohno et al. | 29/890.1 |
| 6,689,700 B1 * | 2/2004 | Watkins et al. | 438/762 |
| 6,741,017 B1 * | 5/2004 | Ide et al. | 313/310 |
| 6,767,819 B2 * | 7/2004 | Lutz | 438/614 |
| 7,054,050 B2 * | 5/2006 | Vincent et al. | 359/269 |
| 2004/0035711 A1 | 2/2004 | Lee et al. | |
| 2006/0189113 A1 * | 8/2006 | Vanheusden et al. | 438/597 |
| 2008/0092953 A1 * | 4/2008 | Lee | 136/261 |
| 2009/0056994 A1 * | 3/2009 | Kuhr et al. | 174/259 |
| 2010/0315191 A1 * | 12/2010 | Xiao et al. | 336/200 |

FOREIGN PATENT DOCUMENTS

| | | | |
|---|---|---|---|
| JP | 2009-040674 | * | 2/2009 |
| JP | 2010-219047 | * | 9/2010 |

* cited by examiner

*Primary Examiner* — Peter DungBa Vo
*Assistant Examiner* — Kaying Kue
(74) *Attorney, Agent, or Firm* — Mark Levy; Hinman, Howard & Kattell, LLP

(57) ABSTRACT

Printed conductive lines and a method of preparing them using polymer nanocomposites with low resistivity and high current carrying capacity. Plasma treatment selectively removes polymers/organics from nanocomposites. Subsequent selective metal is deposited on top of the exposed metal surface of the printed conductive lines in order to improve current carrying capacity of the conductive printed lines. The printed conductive lines use a conductive ink or printing process and are then cured thermally and/or by a lamination process. Next, the printed conductive lines are treated with the plasma for 5-15 minutes in order to remove organics. E-less copper (Cu) is selectively deposited only at the conducting particle surface of the printed conductive lines. If desired, e-less gold, silver, tin, or tin-lead can be deposited on top of the e-less Cu.

26 Claims, 2 Drawing Sheets

METHOD OF FORMING AN ELECTRICALLY CONDUCTIVE PRINTED LINE

FIELD OF INVENTION

The present invention relates to printed circuit boards and, more particularly, to printed circuit boards having conductive lines with low resistivity and high current carrying capacity, and a method of preparation thereof using polymer nanocomposites that reduce overall resistivity and improve current carrying capacity of the conductive lines.

BACKGROUND OF THE INVENTION

In the electronic industry, fabrication of conductive line circuits is vital and inevitable. Traditionally, electroplating and etching processes accompanied by lithography technology are widely adopted in the printing circuit board (PCB) industry for manufacturing circuits. However, this method is not only time consuming but also very complicated, requiring many steps to construct even one layer of the circuit.

For these reasons, the development of convenient and fast processing techniques to fabricate conductive lines has attracted more and more attention in recent years. Using a printing process has several advantages such as selective deposition, repairability and re-printability. However, creating printed conductive lines with low resistivity and high current capacity creates a challenge. It would be advantageous to prepare printed conductive lines using polymer nanocomposites with low resistivity and high current carrying capacity.

No prior art appears to deal with a method to print conductive lines using polymer nanocomposites. Existing patents tend to deal with making printed lines through a different method or with the placement of conductive elements as the primary focus of the invention. One published patent application deals with using polymers to create a more conductive printed line. However, the method requires that a hole be formed on top of the polymer layer in order to remove the metallic substrate.

U.S. Pat. No. 5,039,824 for PRINTED CIRCUIT HAVING TWISTED CONDUCTOR LINES PRINTED THEREON issued Aug. 13, 1981 by Takashima et al. discloses a printed conductor including two twisted conductor lines each having a plurality of segments disposed alternately on opposite surfaces of a circuit board, the successive segments of each line being connected by electrically conductive elements passing through holes in the circuit board.

U.S. Pat. No. 4,604,298 for FINGER LINE SCREEN PRINTING METHOD AND APPARATUS issued Aug. 5, 1986 to Shevtchuk et al. discloses a method of screen printing using a conductive ink applied to a substrate to form a pattern of narrow, closely spaced conductive lines. Before screening, the conductive ink is exposed to ambient air until its viscosity is in the range 700,000 to 900,000 centipoise at 70° Fahrenheit.

United States Published Patent Application No. 2004/0035711 published Feb. 26, 2004 for METHOD OF MANUFACTURING PRINTED CIRCUIT BOARD AND MULTI-LAYERED PCB by Hyuek Jae Lee, et al. discloses a PCB fabrication method consisting of: plating a metal on a pattern-formed metallic substrate to form a conductive metal line; forming a polymer layer as a base substrate over the conductive metal line and drying the formed polymer layer; forming a via hole in the polymer layer, followed by plugging the via hole by electroplating; and removing the metallic substrate.

The patents and application listed above deal with methods of creating a printed circuit and the placement of the conductive elements, but do not focus on a method of making low resistivity printed conductive lines using polymer nanocomposites. No prior art has been found that focuses on creating printed lines and making them more conductive.

When performing the process of electroplating and etching lines on circuitry, a method of choice for printing conductive lines is one that reduces overall resistivity and improves current carrying capacity of the conductive lines.

SUMMARY OF THE INVENTION

Disclosed is a method of creating printed conductive lines with low resistivity and high current carrying capacity using polymer nanocomposites. More specifically, the invention uses plasma treatment to selectively remove polymer/organics from nanocomposites and subsequent selective metal deposition on top of an exposed metal surface of the printed lines. This reduces the overall resistivity and improves the current carrying capacity of the printed conductive lines.

Printed material is a combination of conducting material and organic material and or solvent. Conducting material consists of metal particles and/or solder particles and/or carbon particles, etc. It can also use metal or carbon nanotubes. Average particle size of conducting material can be on the order of microns (1-100 micron) size and/or sub-microns (0.99-0.11 micron) and/or nano (0.1-0.01 micron) size. Organic material can be monomers, oligomers, polymers, flux or their combinations.

A conductive adhesive is a composite material consisting of a nonconductive organic binder and conductive filler particles. Electrical connection is achieved primarily by inter-particle conduction. When the filler content is high enough, the system is transformed into a good electrical conductor. For electrical conduction, particles should make intimate contact (physical and/or tunneling) and form a network or conductive chain, which helps in the transfer of electrons. This conductive path is formed at a threshold volume fraction of the conductive filler which can be calculated using the percolation theory of spherical particles.

The printed conductive lines are formed using a conductive ink or paste, such as an ink-jet, screen, or stencil type. The printed conductive lines are cured either thermally for two hours at 100-200° C. or by lamination for two hours at 125-365° C. with pressure ranging from 100-2500 psi. Plasma treatment is then performed for 15 minutes in order to remove organics. Next, electroless (e-less) copper is selectively deposited only at the conducting particle surface of the printed conductive lines. Finally, if necessary, e-less gold, silver, tin, or tin-lead can be deposited on top of the e-less copper.

BRIEF DESCRIPTION OF THE DRAWINGS

A complete understanding of the present invention may be obtained by reference to the accompanying drawings, when considered in conjunction with the subsequent, detailed description, in which.

DETAILED DESCRIPTION OF THE PREFERRED EMBODIMENT

For a better understanding of the present invention, together with other and further objects, advantages, and capabilities thereof, reference is made to the following disclosure and appended claims in connection with the above-described drawings. The present invention is further described with reference to the accompanying FIGURES where like reference numbers correspond to the same elements.

Figure 1:
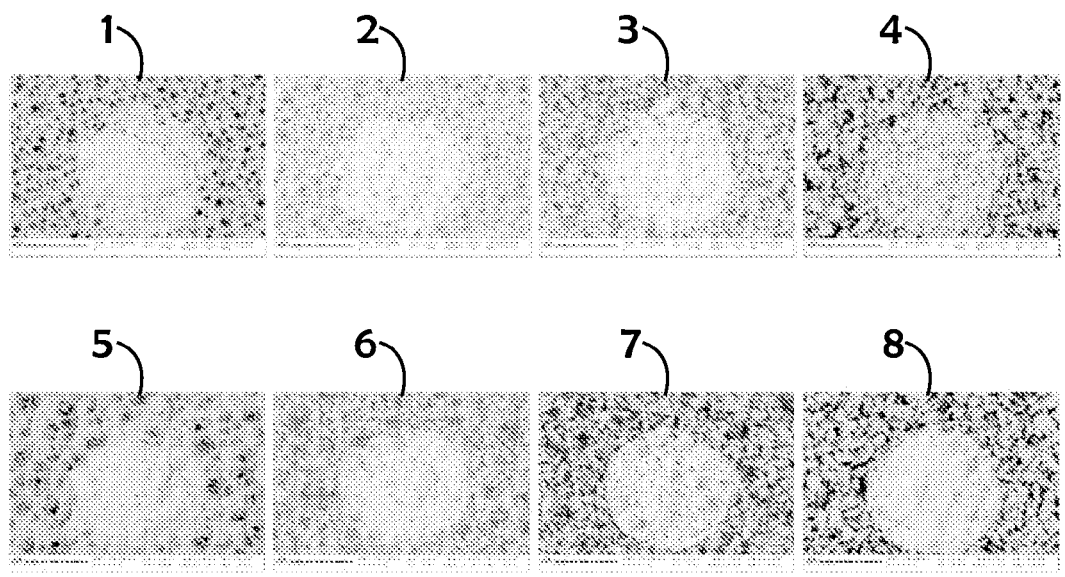
FIG. 1 is a photographic image showing a series of silver paste laminations using one of the preferred embodiments of the invention.

FIG. 1 is a pictorial representation of silver paste laminated with a polyphenylene ether (PPE) polymer, as might be obtained from Asahi Chemical Company, having a business location in Japan, under the product name PC5103, at 180-200° C. for 2-4 hrs at 500-2500 psi with either 12 micron or 1 oz. external Cu. Four different types of treatment dealt with the 12 micron external Cu. The silver paste was treated with 12 micron external Cu and no plasma, image 1, the silver paste was treated with 12 micron external Cu and plasma for 5 minutes, image 2, the silver paste was treated with 12 micron external Cu and plasma for 10 minutes, image 3, and the silver paste was treated with 12 micron Cu and plasma for 15 minutes, image 4.

Four different types of treatment used 1 oz. of external Cu. The silver paste was treated with 1 oz. of external Cu and no plasma, image 5, the silver paste was treated with 1 oz. of external Cu and plasma for 5 minutes, image 6, the silver paste was treated with 1 oz. of external Cu and plasma for 10 minutes, image 7, and the silver paste was treated with 1 oz. of external Cu and plasma for 15 minutes, image 8.

In all of the treatments, the external Cu was blanket etched where the etched surface had pure PPE polymer and organically coated silver paste. The blanket etched surface was plasma treated. As plasma treatment proceeded from 5 to 15 minutes, silica particles from the PPE polymer and silver particles from paste exposed more and more. In other words, 5 to 15 minutes of plasma treatment removed more and more organics to expose inorganic silica or metal silver particles.

Figure 2:
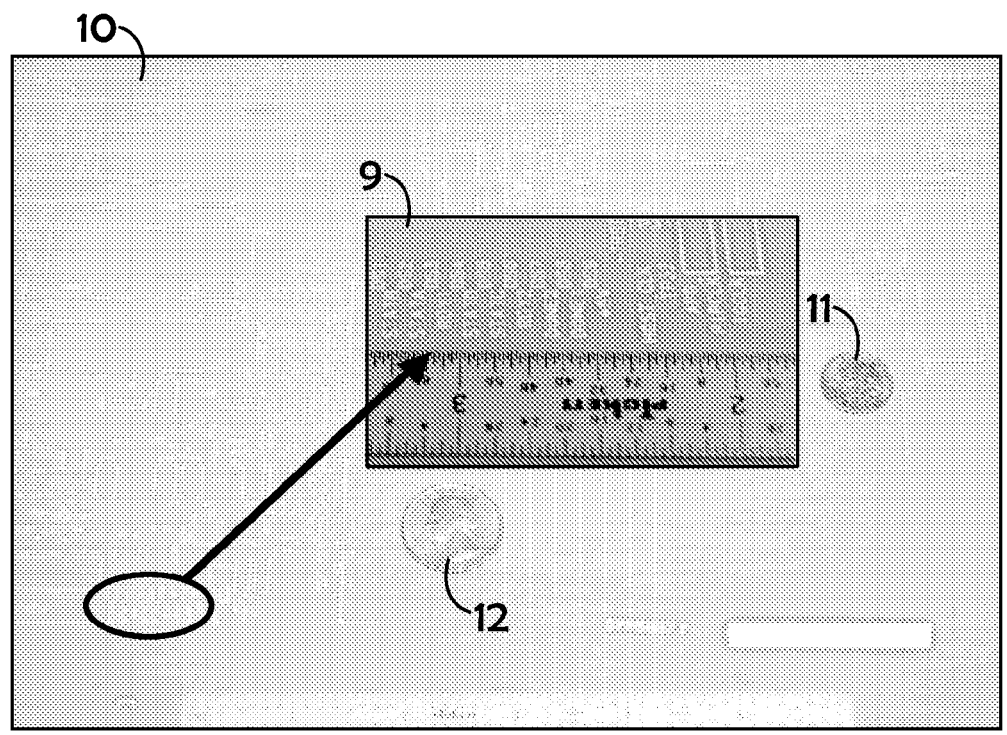
FIG. 2 is a photographic depiction of the printed conductive lines.

FIG. 2 shows cured printed conductive lines 9 on a circuit board 10. The printed conductive lines 9 are enlarged. In addition, a dime 11 and quarter 12 are shown for size comparison to the printed conductive lines 9.

Figure 3A:
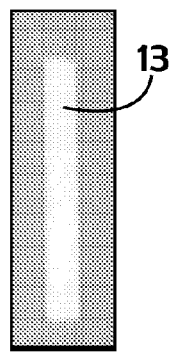
FIG. 3a is a photographic image of an organically coated silver conducting paste film.

FIG. 3a depicts an organically coated silver conducting paste film 13. The film 13 was treated with e-less Cu but no Cu was deposited on the film due to the organic coatings.

Figure 3B:
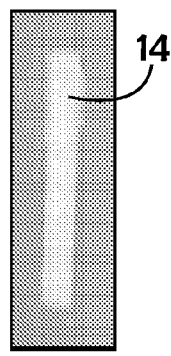
FIG. 3b is a photographic depiction of a silver conducting paste film where silver is exposed at the surface of the films.

FIG. 3b depicts a silver conducting paste film 14 where silver was exposed at the surface. The film 14 was treated with Cu, depositing e-less Cu on top of the film.

An example of an embodiment of this invention is a printed conductive line created by laser drilling a 6 millimeter thick dielectric with 12 micron external Cu to make 50 micron diameter holes. The holes are filled with silver paste containing 88% silver in weight through screen printing. Next, external drilled Cu is etched from the dielectric surface. Then Cu foil or PTFE film release is laminated onto the dielectric having silver paste filled holes at 180-200° C. for 2-4 hrs at 500-2500 psi. The silver paste is cured during lamination. The Cu foil is then etched away, or the PTFE film is peeled away to expose the cured silver paste. The laminate is exposed to plasma for up to 15 minutes to remove organics from the silver paste surface. The laminates are thoroughly washed with water and cleaned with acid prior to metal deposition. After this procedure, the peel strength of the metal deposited surface increases from 0.3 lb/inch to 0.6 lb/inch if the plasma treatment is increased from 5 to 15 minutes. These peel values result from a combination of adhesion to plasma-treated silver paste and dielectric.

A second embodiment of the invention includes using a 40 micron thick silver adhesive line and depositing it on a glass substrate. It is then cured at 190° C. for 2 hrs. The cured paste is then treated with e-less Cu solution at 50° C. for about an hour. In this embodiment, no Cu is deposited on top of conducting adhesive lines due to organic coatings.

A third embodiment of the invention includes a 40 micron thick silver adhesive line being deposited on a glass substrate and cured at 190° C. for 2 hrs. This curing can be performed in a convection oven in air, nitrogen, or inert gas ambients. Curing can also be performed in an IR oven or using UV. It is subsequently plasma treated. The plasma treated lines are thoroughly cleaned and treated with e-less Cu solution at 50° C. for about an hour. Lastly, a thin layer of metallic Cu is deposited on top of conducting adhesive lines.

A fourth embodiment of the invention includes a glass substrate with a Cu coated plasma-treated cured conductive adhesive line being dipped into tin-lead electrolytic solution in an electroplating bath and then stirred vigorously at 26° C. The tin-lead rod is used as an anode while thin Cu coated cured conductive adhesive lines are used as cathode materials for the electroplating process. Around 30 amps/ft$^2$ current density is used for the tin-lead solder electroplating/coating Cu surface. Subsequently, a thin layer of solder is deposited on the Cu surface. The solder and Cu coated cured conductive adhesive line are removed from the electrolytic solution and washed with water and air dried at room temperature.

A fifth embodiment of the invention includes a glass substrate with Cu coated plasma-treated cured conductive adhesive lines being slowly dipped into autocatalytic gold solution. Then the solution is stirred for 1 hr at 80° C. in order to deposit gold and produce gold-Cu coated conductive adhesive lines. Next, the Cu substrate with gold-Cu coated conductive adhesive lines are again separated from solution and washed with DI water and air dried at room temperature.

A sixth embodiment of the invention includes dissolving 10 gm of thiourea in 75 ml in water at 65° C. Next, a glass substrate with a Cu coated plasma-treated cured conductive adhesive line is slowly dipped into the thiourea solution at 65° C. and stirred. Then around 80 ml immersion tin solution is drop-wise added to the solution. The tin is deposited on top of the Cu surface of cured conductive adhesive lines. Finally, the Cu substrate with tin-Cu coated conductive adhesive lines is again separated from solution and washed with DI water and air dried at room temperature.

A seventh embodiment of the invention includes printed lines with metal loading ranges from 25 wt % to 99 wt % and up to 75 wt % organics which decompose at low temperature (100-200° C.) to produce conducting lines.

An eighth embodiment of the invention includes printed lines with single or multiple metals and or solder-coated polymers to produce conducting lines after curing. For solder-coated particles, the curing temperature should be at or above the melting point of solder.

A ninth embodiment of the invention includes printed lines with single or multiple metals and/or solder particles to produce conducting lines after curing. For a mixture of metal and solder particles in the paste, the curing temperature should be at or above the melting point of the lowest temperature melt solder in the paste. For example, for printed lines consisting of tin-bismuth and tin-lead solder particles in the paste, use a curing temperature of the least tin-bismuth melting temperature. In that case tin-lead particles will not melt during curing and will act as conducting particles, not as solder. If the curing temperature is equivalent to or above the tin-lead melting point, then both tin-bismuth and tin-lead in the paste will melt. For a mixture of metals (e.g., Au, Ag, Cu, Pt, etc.) and solder particles, solder will melt in the presence of organics (e.g., flux) during curing of the conductive paste, and the melt will dissolve or precipitate metal particles. As a result, the top surface of printed conducting lines will have excess solder and the bottom part of conducting lines will have excess metal.

A tenth embodiment of the invention includes printed lines with larger metal flakes (e.g., 30 micron silver flakes) to produce conducting lines after curing even when the metal flake loading is below the threshold of conducting paste. Larger metal flakes can float during curing and can produce a metal network on the top surface to make the printed lines conducting. This sort of conducting line may not require plasma to deposit e-less Cu on top of the metal surface.

An eleventh embodiment of the invention includes printed lines with larger metal flakes (e.g., 30 micron silver flakes) to produce the top conducting lines and bottom non-conducting (insulation) lines after curing. At very low loading, larger metal flakes can float during curing and produce a metal network on the top surface to make the top of the printed lines conducting. On the other hand, the bottom part of the printed lines will have excess organic sufficient to make the bottom part non-conducting. Thus, it possible to produce a printed conducting layer separated by a thin insulating layer in a one-step printing process.

A final embodiment of the invention includes printed lines with high enough metal loading to produce sintered metal conducting lines after curing. Using 92 wt % nano-micro silver with 8 wt % epoxy sinters in the range 240-300° C. depending on average nano particle size and nano-micro ratio. This sort of conducting line may not require plasma to deposit e-less Cu on top of a sintered metal surface. It is also possible to produce sintered and melted conducting lines after curing.

Since other combinations, modifications and changes varied to fit particular operating requirements and environments will be apparent to those skilled in the art, the invention is not considered limited to the chosen preferred embodiments for purposes of this disclosure, but covers all changes and modifications which do not constitute departures from the true spirit and scope of this invention.

What is claimed is:

1. A method of forming an electrically conductive printed line with low resistivity and high current carrying capacity, the method comprising using polymer nanocomposites having an electrically conducting material and an organic material to print and cure said electrically conductive printed line having a conducting particle service chosen from the group: ink in a jet of ink, and paste in a jet of ink, a screen, and a stencil, said printed and cured polymer nanocomposite being treated with plasma to remove organics and expose conducting particle surface, and subsequently e-less copper (Cu) deposited selectively at the exposed conducting particle surface on top of at least one of the group: gold, silver, tin, and tin-lead, said selective metal deposition reducing overall resistivity and improving current capacity of said printed and cured polymer nanocomposite line.

2. The method of claim 1, wherein the electrically conductive printed line is cured thermally at 100-200° C. for approximately two hours.

3. The method of claim 1, wherein the electrically conductive printed line is treated with plasma for approximately 5-15 minutes in order to remove organics.

4. The method of claim 3, where said plasma is generated using an oxygen-containing gas.

5. The method of claim 1, wherein the electrically conductive printed line is cured through lamination at 125-365° for two hours with a pressure ranging from 100-2500 psi.

6. The method of claim 1, wherein said electrically conductive printed line is formed with metal loading ranges from 25 wt % to 99 wt % and up to 75 wt % organics which decompose at low temperature (100-200° C.).

7. The method of claim 1, wherein said electrically conductive printed line is formed, after curing, with at least one of the following materials: a single metal, multiple metals, and solder-coated particles.

8. The method of claim 7, wherein the curing temperature for said solder-coated particles is at least the temperature of the melting point of solder.

9. The method of claim 7, wherein the curing temperature for said metal and said solder-coated particles is at least the temperature of the melting point of the lowest temperature melt solder.

10. The method of claim 7, further comprising silver flakes having dimensions of approximately 30 microns.

11. The method of claim 10, wherein said silver flakes are incorporated in top electrically conductive printed lines and in bottom, non-conductive printed lines.

12. The method of claim 1, wherein said electrically conductive printed line is formed with metal loading ranges sufficiently high to produce sintered metal conducting lines after curing.

13. The method of claim 12, wherein said electrically conductive printed line is formed with a metal loading of 92 wt % nano-micro silver with 8 wt % epoxy sinters in the range 240-300° C.

14. A method of forming an electrically conductive printed line having a conducting particle service chosen from the group: ink in a jet of ink, and paste in a jet of ink, a screen, and a stencil, said method using a single printing process and a single polymer nanocomposite, wherein said polymer nanocomposite comprises metal flakes having dimensions of approximately 30 microns and a polymer producing top conducting lines and bottom non-conducting lines after curing and wherein said metal flakes float and separate from said polymer during curing.

15. A method of forming an electrically conductive printed sintered line having a conducting particle service chosen from the group: ink in a jet of ink, and paste in a jet of ink, a screen, and a stencil, said electrically conductive printed sintered line having low resistivity and high current carrying capacity, the method comprising:
  a) providing polymer nanocomposites with sufficient metal loading to sinter during curing; and
  b) subsequently plasma treating said electrically conductive printed sintered line to remove organics and expose a sintered metal surface and to deposit a thin metal layer selectively thereon, said thin selective deposited metal layer reducing overall resistivity and improving current capacity of said printed sintered line.

16. The method of claim 15, wherein said electrically conductive printed line is formed with a metal loading of approximately 92 wt % nano-micro silver and approximately 8 wt % epoxy and said electrically conductive printed line sinters in the temperature range of approximately 240-300° C.

17. A method of forming an electrically conductive printed line with low resistivity and high current carrying capacity, the method comprising using polymer nanocomposites to reduce overall resistivity and improve current capacity of the electrically conductive printed line, wherein said electrically conductive printed line has a conducting particle service chosen from the group: ink in a jet of ink, and paste in a jet of ink, a screen, and a stencil, and wherein the electrically conductive printed line is treated with plasma for approximately 5-15 minutes in order to remove organics and cured thermally at 100-365° C. for approximately two hours with a pressure ranging from 100-2500 psi.

18. The method of claim 17, where said plasma is generated using an oxygen-containing gas.

19. The method of claim 17, wherein e-less copper (Cu) is selectively deposited at the conducting particle surface of the electrically conductive printed line.

20. The method of claim 19, wherein said Cu is optionally deposited on top of at least one of the group: gold, silver, tin, and tin-lead.

21. The method of claim 17, wherein said electrically conductive printed line is formed, after curing, with at least one of the following materials: a single metal, multiple metals, and solder-coated particles, and said electrically printed line further comprises silver flakes having dimensions of approximately 30 microns.

22. The method of claim 21, wherein said silver flakes are incorporated in top electrically conductive printed lines and in bottom, non-conductive printed lines.

23. The method of claim 17, wherein said electrically conductive printed line is formed with metal loading ranges sufficiently high to produce sintered metal conducting lines after curing.

24. The method of claim 23, wherein said electrically conductive printed line is formed with a metal loading of 92 wt % nano-micro silver with 8 wt % epoxy sinters in the range 240-300° C.

25. A method of forming an electrically conductive printed line having a conducting particle service chosen from the group: ink in a jet of ink, and paste in a jet of ink, a screen, and a stencil, said method using a single printing process with low resistivity and high current carrying capacity, wherein polymer nanocomposites comprising silver flakes having dimensions of approximately 30 microns produce top conducting lines and bottom non-conducting lines after curing.

26. A method of forming an electrically conductive printed sintered line having a conducting particle service chosen from the group: ink in a jet of ink, and paste in a jet of ink, a screen, and a stencil, said electrically conductive printed sintered line having low resistivity and high current carrying capacity, the method comprising: a) using polymer nanocomposites with metal loading of approximately 92 wt % nano-micro silver and approximately 8 wt % epoxy to sinter in the temperature range of approximately 240-300° C. during curing; and b) subsequently plasma treating said electrically conductive printed sintered line to deposit a thin metal layer thereon to reduce overall resistivity and improve current capacity of the electrically conductive printed line.

* * * * *